US012787651B2

(12) United States Patent
Iwai et al.

(10) Patent No.: US 12,787,651 B2
(45) Date of Patent: Nov. 3, 2026

(54) ELECTRONIC DEVICE

(71) Applicant: SEIKO EPSON CORPORATION, Tokyo (JP)

(72) Inventors: Hikaru Iwai, Matsukawa-machi (JP); Masahiro Komatsu, Matsumoto (JP); Kanechika Kiyose, Matsumoto (JP); Hiroshi Matsuda, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 872 days.

(21) Appl. No.: 18/296,009

(22) Filed: Apr. 5, 2023

(65) Prior Publication Data

US 2023/0329121 A1 Oct. 12, 2023

(30) Foreign Application Priority Data

Apr. 7, 2022 (JP) ................................ 2022-063807

(51) Int. Cl.
*H01L 41/053* (2006.01)
*H10N 30/87* (2023.01)
*H10N 30/88* (2023.01)

(52) U.S. Cl.
CPC ............. *H10N 30/87* (2023.02); *H10N 30/88* (2023.02)

(58) Field of Classification Search
CPC ............................... H10N 30/87; H10N 30/88
USPC .................................................. 310/365, 366
See application file for complete search history.

(56) References Cited

U.S. PATENT DOCUMENTS

2015/0280688 A1* 10/2015 Ortiz ...................... H10N 30/88 310/313 R
2021/0202823 A1 7/2021 Osawa et al.

FOREIGN PATENT DOCUMENTS

| | | | |
|---|---|---|---|
| JP | H05175257 | A | 7/1993 |
| JP | 2002360628 | A | 12/2002 |
| JP | 2006156574 | A | 6/2006 |
| JP | 2006222126 | A | 8/2006 |
| JP | 2021106183 | A | 7/2021 |

OTHER PUBLICATIONS

Office Action for JP Patent Application No. 2022063807, issued on Jan. 13, 2022, 6 pages.
Office Action for JP Patent Application No. 2022063807, issued on May 12, 2026, 6 pages.

* cited by examiner

*Primary Examiner* — Derek J Rosenau
(74) *Attorney, Agent, or Firm* — CHIP LAW GROUP

(57) ABSTRACT

An electronic device includes elements, a first substrate including a first surface having a first electrode coupled to the elements and a second electrode coupled to the elements, and a second substrate having a second surface and a third surface and placed with the second surface facing the first surface, wherein the second substrate has a first opening penetrating the second substrate, and a second opening penetrating the second substrate, a first through electrode electrically coupled to the first electrode is provided in the first opening, a second through electrode electrically coupled to the second electrode is provided in the second opening, in a plan view of the third surface, an area of the first through electrode is larger than an area of the first opening and an area of the second through electrode is larger than an area of the second opening.

5 Claims, 9 Drawing Sheets

ELECTRONIC DEVICE

The present application is based on, and claims priority from JP Application Serial Number 2022-063807, filed Apr. 7, 2022, the disclosure of which is hereby incorporated by reference herein in its entirety.

BACKGROUND

1. Technical Field

The present disclosure relates to an electronic device.

2. Related Art

In related art, electronic devices having piezoelectric elements arranged in matrix forms are known. For example, JP-A-2021-106183 discloses an electronic device including a sealing plate having an opening, a vibrating plate closing the opening, and a piezoelectric element placed on the vibrating plate and having a piezoelectric material sandwiched by an upper electrode and a lower electrode.

In the sealing plate, a pair of through holes are provided and through electrodes are placed within the through holes. The upper electrode and the lower electrode are respectively electrically coupled to the through electrodes. A wiring board placed to face the sealing plate includes pads and the through electrodes projecting toward the wiring board and the pads electrically contact. Accordingly, the upper electrode and the lower electrode are respectively electrically coupled to the pads via the through electrodes.

Note that voltages are applied to the pads and the piezoelectric element is driven, and thereby, ultrasonic wave may be transmitted. Further, a potential difference generated by vibration of the piezoelectric material according to sound pressure of the ultrasonic wave reflected by an object is measured, and thereby, the ultrasonic wave is detected. Therefore, the time after the transmission and before the reception of the ultrasonic wave is measured, and thereby, the distance between the electronic device and the object may be measured.

However, in the electronic device disclosed in JP-A-2021-106183, the through electrodes within the through holes are joined only to the inner walls of the through holes and the adhesion between the through electrodes and the inner walls of the through holes is not sufficient. There is a problem that defects such as separation of the through electrodes from the inner walls of the through holes and cracking in the surfaces of the through electrodes are caused and the through electrodes fall from the through holes.

SUMMARY

An electronic device includes an element, a first substrate including a first surface having a first electrode coupled to the element and a second electrode coupled to the element and placed in a position different from that of the first electrode, and a second substrate having a second surface and a third surface and placed with the second surface facing the first surface, wherein the second substrate has a first opening penetrating from the second surface to the third surface in a position corresponding to the first electrode, and a second opening penetrating from the second surface to the third surface in a position corresponding to the second electrode, a first through electrode electrically coupled to the first electrode is provided in the first opening, a second through electrode electrically coupled to the second electrode is provided in the second opening, in a plan view of the third surface, an area of the first through electrode is larger than an area of the first opening, and, in the plan view of the third surface, an area of the second through electrode is larger than an area of the second opening.

DESCRIPTION OF EXEMPLARY EMBODIMENTS

1. First Embodiment

First, an electronic device 1 according to a first embodiment will be explained with reference to FIGS. 1 to 6 using an electronic device having ultrasonic transducers 32 as an example.

For convenience of explanation, in the following drawings, an X-axis, a Y-axis, and a Z-axis are shown as three axes orthogonal to one another. Directions along the X-axis are referred to as "X directions", directions along the Y-axis are referred to as "Y directions", and directions along the Z-axis are referred to as "Z directions". Further, a pointer side of each axis is also referred to as "plus side" and the opposite side to the pointer side is also referred to as "minus side".

Figure 1:
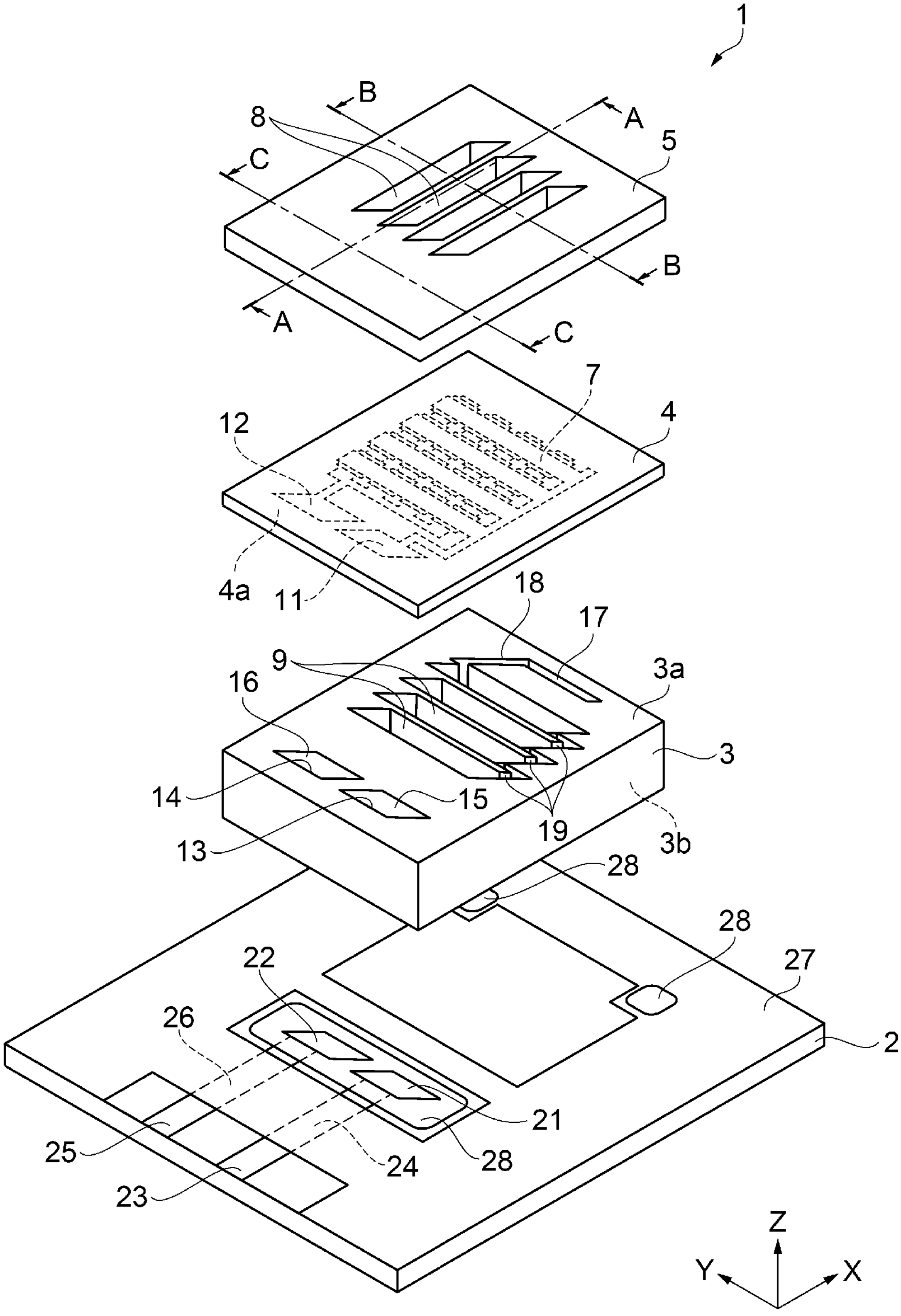
FIG. 1 is a schematic exploded perspective view showing a configuration of an electronic device according to a first embodiment.

As shown in FIG. 1, the electronic device 1 includes a third substrate 2, a second substrate 3, a first substrate 4, and a fourth substrate 5 sequentially stacked.

The third substrate 2, the second substrate 3, the first substrate 4, and the fourth substrate 5 have rectangular shapes in a plan view as seen from the Z directions. The longitudinal directions of the third substrate 2, the second substrate 3, the first substrate 4, and the fourth substrate 5 are the X directions, and the lateral directions of the third substrate 2, the second substrate 3, the first substrate 4, and the fourth substrate 5 are the Y directions. The second substrate 3, the first substrate 4, and the fourth substrate 5 have the same shapes. The third substrate 2 is larger than the second substrate 3, the first substrate 4, and the fourth substrate 5.

The first substrate 4 includes a first surface 4*a* at the side facing the second substrate 3. Elements 7 are arranged in a matrix form on the first surface 4*a*. The elements 7 are piezoelectric elements. Alternating-current voltages are applied to the elements 7, and thereby, the electronic device 1 may vibrate the first substrate 4 and output ultrasonic wave. The first substrate 4 is also referred to as "vibrating plate".

The number of the elements 7 is not particularly limited. In the embodiment, for example, the elements 7 form an arrangement of four rows and four columns and the number of the elements 7 is 16.

The fourth substrate 5 includes four fourth holes 8 elongated in the X directions. The shape of the fourth hole 8 is substantially a parallelogram as seen from the Z directions. The fourth substrate 5 is formed using a silicon single-crystal substrate. The fourth holes 8 are formed by wet-etching. A side surface of the fourth hole 8 is crystal faces at a lower etching rate. In the silicon single-crystal substrate, crystal faces at the lower etching rate forms substantially a parallelogram shape and the shape of the fourth hole 8 is substantially the parallelogram. The fourth holes 8 penetrate the fourth substrate 5. The fourth holes 8 are placed in locations facing the arrangement of the elements 7. Note that the number of the fourth holes 8 is not limited to four.

The second substrate 3 has a second surface 3*a* and a third surface 3*b*. The second surface 3*a* is placed to face the first surface 4*a* of the first substrate 4. The second substrate 3 includes four second grooves 9 elongated in the Y directions in the second surface 3*a*. The shape of the second groove 9 as seen from the Z directions is substantially a parallelogram. The second substrate 3 is formed using a silicon single-crystal substrate. The second grooves 9 are formed by wet-etching. Accordingly, the shape of the second groove 9 is substantially the parallelogram. The second grooves 9 are placed in locations facing the arrangement of the elements 7.

The elements 7 are placed in locations where the fourth holes 8 and the second grooves 9 cross as seen from the Z directions. Accordingly, the first substrate 4 may vibrate toward the plus side in the Z direction and the minus side in the Z direction in the locations where the elements 7 are placed.

The first substrate 4 and the fourth substrate 5 are integrally provided. The material of the first substrate 4 is silicon oxide and the first substrate 4 is formed by oxidation of the fourth substrate 5.

The first substrate 4 includes a first electrode 11 as a common terminal and a second electrode 12 as a drive terminal on the first surface 4*a*. The first electrode 11 and the second electrode 12 are electrically coupled to the elements 7.

The second substrate 3 has a first opening 13 penetrating from the second surface 3*a* to the third surface 3*b* in a position corresponding to the first electrode 11. The second substrate 3 has a second opening 14 penetrating from the second surface 3*a* to the third surface 3*b* in a position corresponding to the second electrode 12.

The size of the first opening 13 is not particularly limited. In the embodiment, for example, the length of the long side of the first opening 13 is about 1 mm and the width of the first opening 13 in the X directions is about 350 μm. The thickness of the second substrate 3 is about 400 μm. Note that the size of the second opening 14 is the same as the size of the first opening 13.

A first through electrode 15 is provided at the minus side in the Z direction of the first electrode 11 in the first opening 13 of the second substrate 3. The first through electrode 15 is electrically coupled to the first electrode 11. A second through electrode 16 is provided at the minus side in the Z direction of the second electrode 12 in the second opening 14 of the second substrate 3. The second through electrode 16 is electrically coupled to the second electrode 12.

The second substrate 3 includes an open hole 17 at the plus side in the X direction of the second grooves 9. The open hole 17 penetrates from the second surface 3*a* to the third surface 3*b*. The open hole 17 and the second grooves 9 are connected by a first communication groove 18. The four second grooves 9 are connected by second communication grooves 19 to each another.

The second substrate 3 and the first substrate 4 are bonded and fixed. The second grooves 9 are connected to the open hole 17, the first communication groove 18, and the second communication grooves 19 and not tightly closed. When the first substrate 4 vibrates, the air within the second grooves 9 communicates with the outside air and the pressure within the second grooves 9 is hard to fluctuate. Accordingly, the first substrate 4 easily vibrates.

The third substrate 2 is placed to face the third surface 3*b* of the second substrate 3. The third substrate 2 has a third electrode 21 as a common connecting terminal in a location corresponding to the first through electrode 15. The third electrode 21 is electrically coupled to the first through electrode 15. The third substrate 2 includes a fourth electrode 22 as a drive connecting terminal in a location corresponding to the second through electrode 16. The fourth electrode 22 is electrically coupled to the second through electrode 16.

According to the configuration, the third electrode 21 is electrically coupled to the first through electrode 15 and the fourth electrode 22 is electrically coupled to the second through electrode 16. Therefore, electric power is supplied to the third electrode 21 and the fourth electrode 22, and thereby, a voltage may be applied between the first electrode 11 and the second electrode 12.

The third substrate 2 includes a first external electrode 23 at the minus side in the X direction of the third electrode 21. The first external electrode 23 and the third electrode 21 are electrically coupled by a wire 24. The third substrate 2 includes a second external electrode 25 at the minus side in the X direction of the fourth electrode 22. The second external electrode 25 and the fourth electrode 22 are electrically coupled by a wire 26.

The wire 24 and the wire 26 are covered by a resist 27. The third electrode 21, the fourth electrode 22, the first external electrode 23, and the second external electrode 25 are exposed, not covered by the resist 27.

On the end at the plus side in the X direction of the second substrate 3, the corner at the plus side in the Y direction and the corner at the minus side in the Y direction are bonded and fixed to the third substrate 2 by fixing adhesives 28. On the end at the minus side in the X direction of the second substrate 3, the peripheries of the first through electrode 15 and the second through electrode 16 are bonded and fixed to the third substrate 2 by a fixing adhesive 28.

Figure 2:
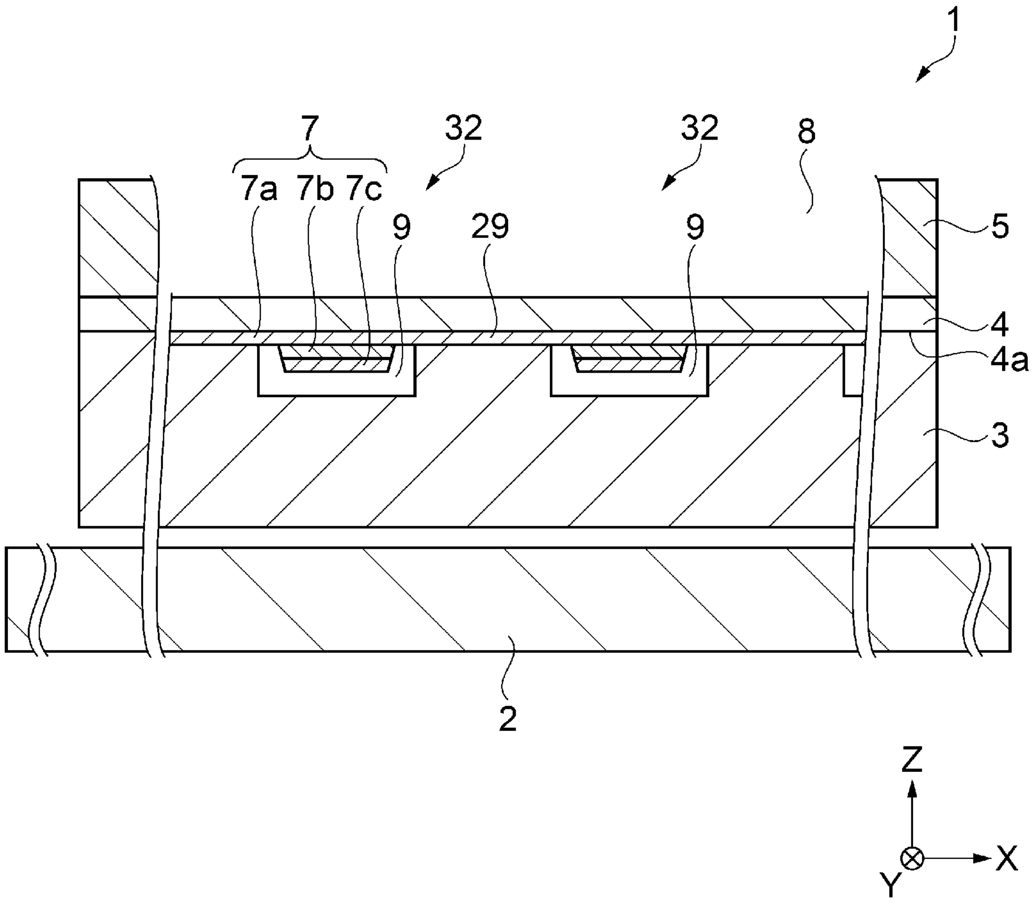
FIG. 2 is a sectional view along line A-A in FIG. 1.
Figure 3:
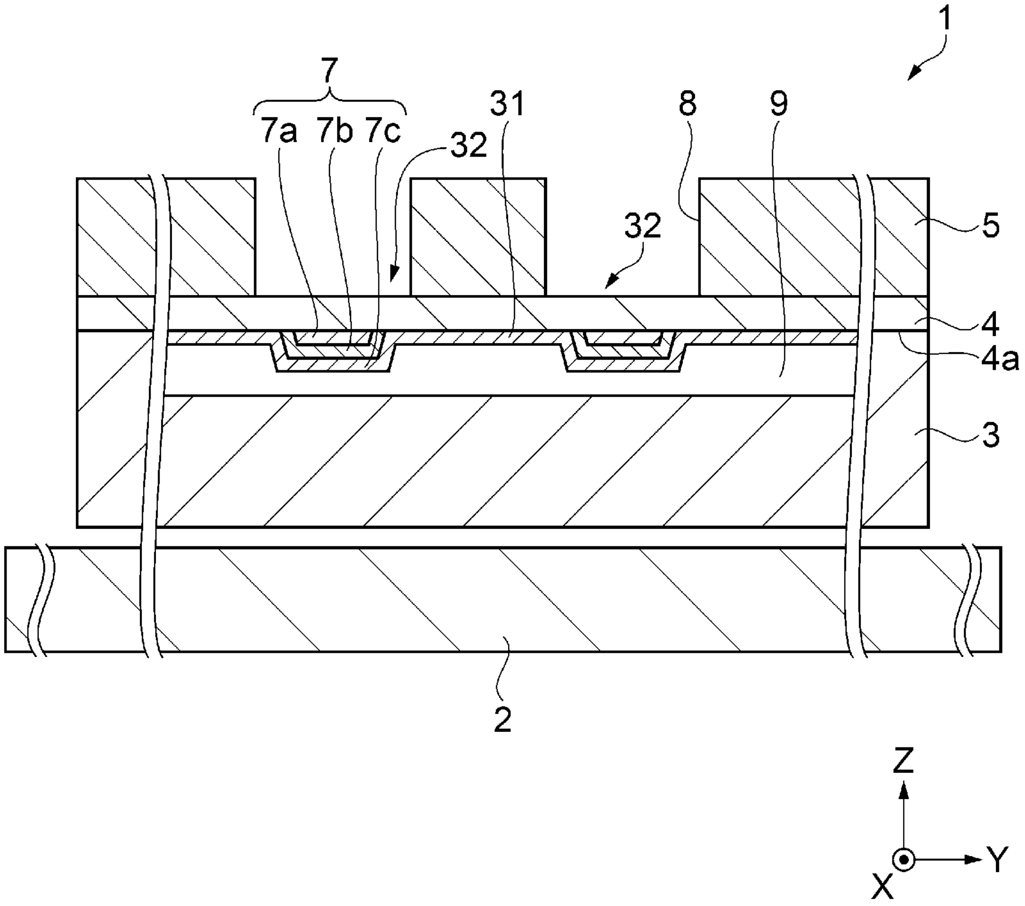
FIG. 3 is a sectional view along line B-B in FIG. 1.

As shown in FIGS. 2 and 3, the elements 7 are placed in the locations where the fourth holes 8 and the second grooves 9 cross as seen from the Z directions. The elements 7 are placed on the first surface 4*a* of the first substrate 4. The element 7 includes a drive electrode 7*a*, a piezoelectric film 7*b*, and a common electrode 7*c* placed to be stacked at the minus side in the Z direction from the first surface 4*a*.

The piezoelectric film 7*b* formed using e.g., transition metal oxide having a perovskite structure. Specifically, the piezoelectric film 7*b* is formed using lead zirconate titanate (PZT) containing Pb, Ti, and Zr.

A plurality of the drive electrodes 7*a* are electrically coupled to drive wires 29 extending in the X directions. The drive electrodes 7*a* and the drive wires 29 are formed using the same material. A plurality of the common electrodes 7*c* are electrically coupled to common wires 31 extending in the Y directions. The common electrodes 7*c* and the common wires 31 are formed using the same material.

The ultrasonic transducers 32 are formed by the first substrate 4 and the elements 7. The common electrodes 7*c* are maintained at a predetermined reference potential. Drive pulse signals are input to the drive electrodes 7*a*, and the elements 7 are deformed and the first substrate 4 vibrates. Thereby, the ultrasonic transducers 32 transmit ultrasonic waves toward the plus side in the Z direction. When there is an object at the plus side in the Z direction of the electronic device 1, the ultrasonic waves are reflected by the object. The reflected ultrasonic waves pass through the fourth holes 8 of the fourth substrate 5 and reach the ultrasonic transducers 32, and the first substrate 4 vibrates according to the sound pressure of the ultrasonic waves. The piezoelectric films 7*b* are deformed by the vibration of the first substrate 4 and potential differences are generated between the drive electrodes 7*a* and the common electrodes 7*c*. Thereby, reception signals according to the sound pressure of the received ultrasonic waves are output from the drive electrodes 7*a* of the ultrasonic transducers 32. That is, the ultrasonic waves are detected.

The time after the electronic device 1 transmits the ultrasonic wave and before receiving the ultrasonic wave is measured, and thereby, the distance between the electronic device 1 and the object may be measured.

Figure 4:
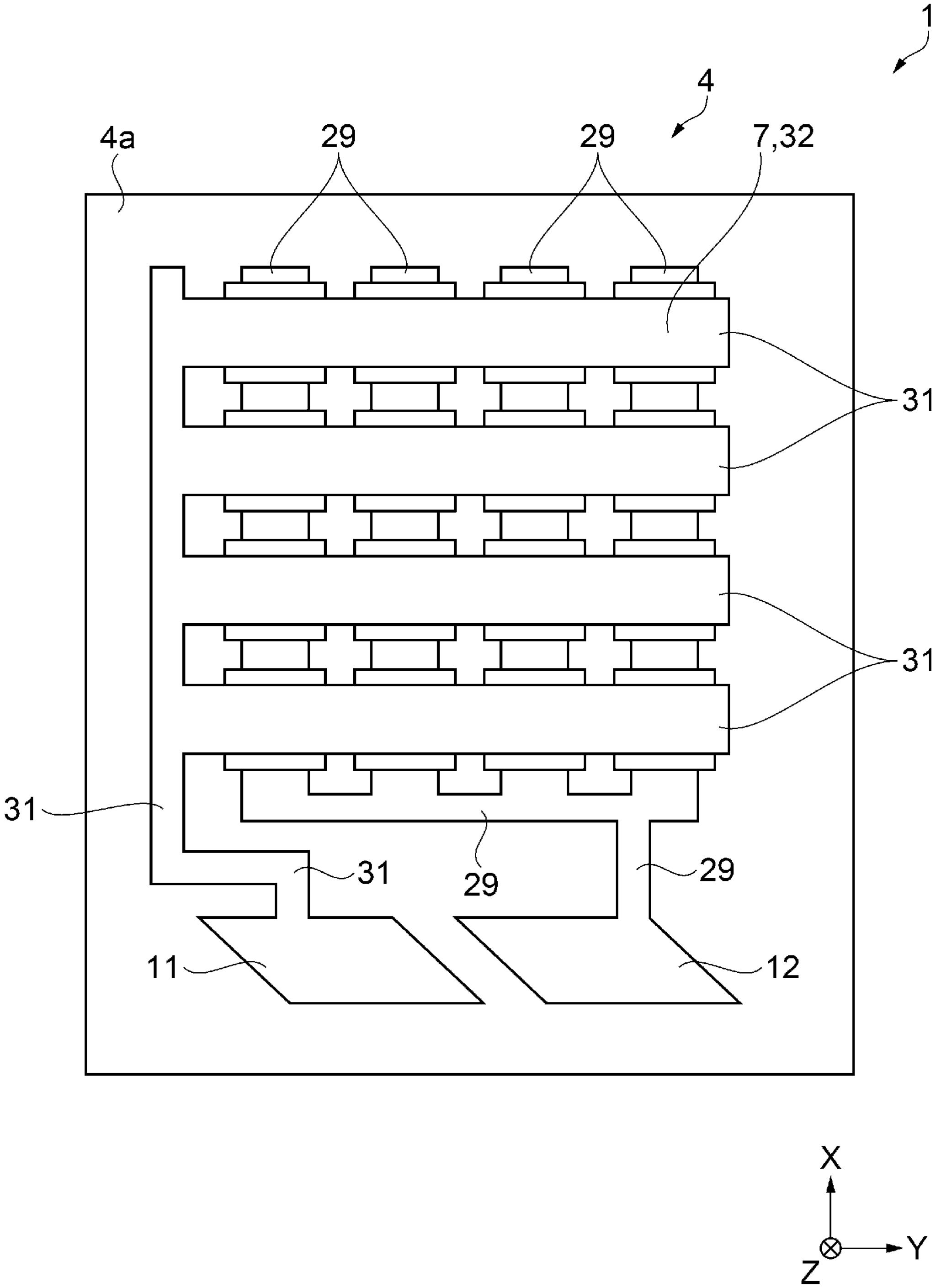
FIG. 4 is a plan view showing a configuration of a first substrate.

As shown in FIG. 4, the four drive wires 29 extending in the X directions are placed on the first surface 4*a* of the first substrate 4. The respective drive wires 29 are integrated at the minus side in the X direction and electrically coupled to the second electrode 12. The four common wires 31 extending in the Y directions are placed on the first surface 4*a* of the first substrate 4. The respective common wires 31 are integrated at the minus side in the Y direction and electrically coupled to the first electrode 11.

Figure 5:
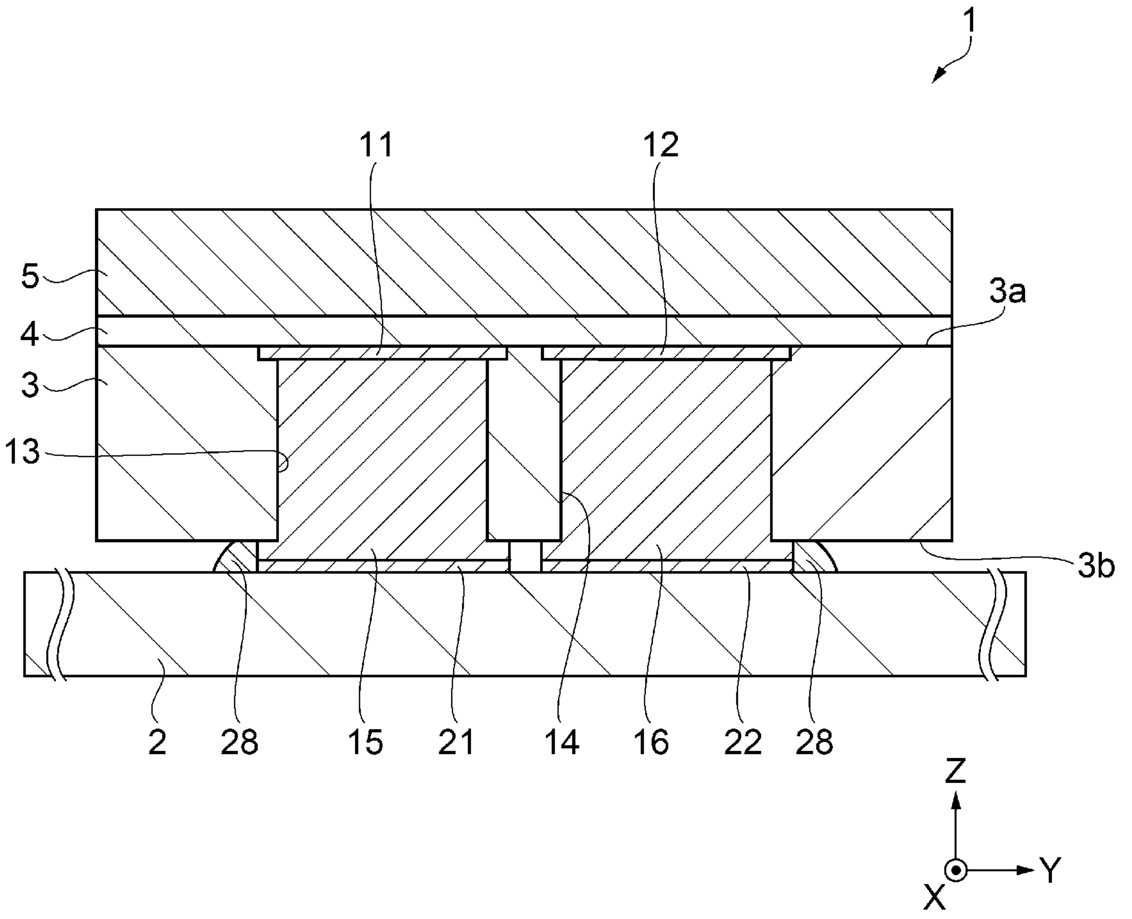
FIG. 5 is a sectional view along line C-C in FIG. 1.

As shown in FIG. 5, the third substrate 2 is placed to face the third surface 3*b* of the second substrate 3, and has the third electrode 21 electrically coupled to the first through electrode 15 and the fourth electrode 22 electrically coupled to the second through electrode 16.

The third electrode 21 is electrically coupled to the first electrode 11 via the first through electrode 15. Further, the fourth electrode 22 is electrically coupled to the second electrode 12 via the second through electrode 16. Therefore, electric power is supplied to the third electrode 21 and the fourth electrode 22, and thereby, a voltage may be applied between the first electrode 11 and the second electrode 12.

The first through electrode 15 and the second through electrode 16 are formed using conductive adhesives. Specifically, the first through electrode 15 and the second through electrode 16 are resins containing silver fillers. The resins are formed by heating and solidification of resin adhesives. As the resin adhesives, e.g., epoxy resin, urethane resin, and silicone resin adhesives may be used.

Figure 6:
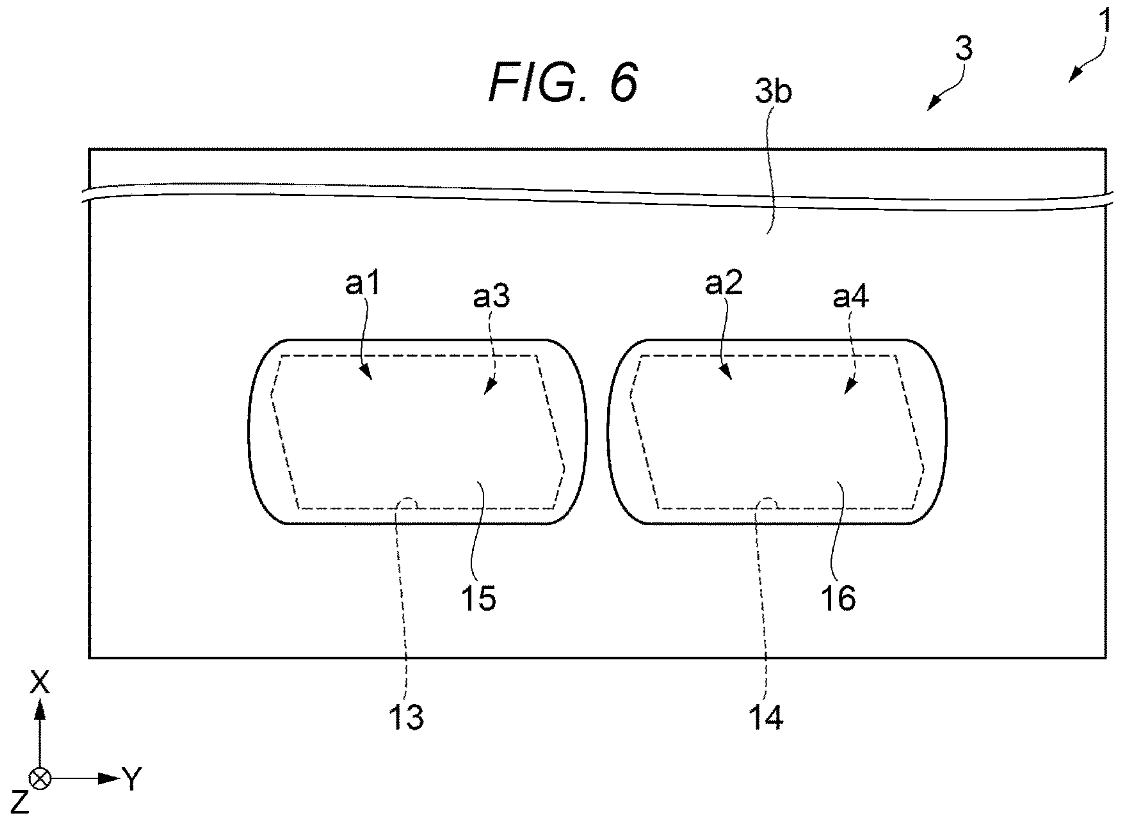
FIG. 6 is a plan view showing configurations of a second substrate and through electrodes.

As shown in FIG. 6, regarding the first through electrode 15 and the second through electrode 16, an area a1 of the first through electrode 15 is larger than an area a3 of the first opening 13 and an area a2 of the second through electrode 16 is larger than an area a4 of the second opening 14 in the plan view of the third surface 3*b*. Accordingly, compared to a case where the through electrodes 15, 16 are joined only to inner walls of the openings 13, 14, i.e., a case where the areas a1, a2 of the through electrodes 15, 16 are the same as the areas a3, a4 of the openings 13, 14, the joining areas on the third surface 3*b* are added to the joining areas of the inner walls of the openings 13, 14, and the joining areas are larger. Therefore, the joining strength between the second substrate 3 and the first through electrode 15 and second through electrode 16 may be increased and falling of the through electrodes 15, 16 from the openings 13, 14 may be suppressed.

As described above, in the electronic device 1 of the embodiment, the area a1 of the first through electrode 15 is larger than the area a3 of the first opening 13 and the area a2 of the second through electrode 16 is larger than the area a4 of the second opening 14 in the plan view of the third surface 3*b*. Accordingly, the joining areas are larger and the adhesion between the second substrate 3 and the through electrodes 15, 16 may be increased. As a result, defects such as separation of the through electrodes 15, 16 from the inner walls of the openings 13, 14 and cracking in surfaces of the through electrodes 15, 16 may be suppressed and falling of the through electrodes 15, 16 from the openings 13, 14 may be suppressed.

2. Second Embodiment

Next, a second substrate 301 of an electronic device 1*a* according to a second embodiment will be explained with reference to FIGS. 7 and 8.

The second substrate 301 of the embodiment is the same as the second substrate 3 of the first embodiment except that dimples 50 are provided in the third surface 3*b*. Note that the explanation will be made with a focus on the differences from the above described first embodiment and the same items have the same signs and the explanation thereof will be omitted.

Figure 7:
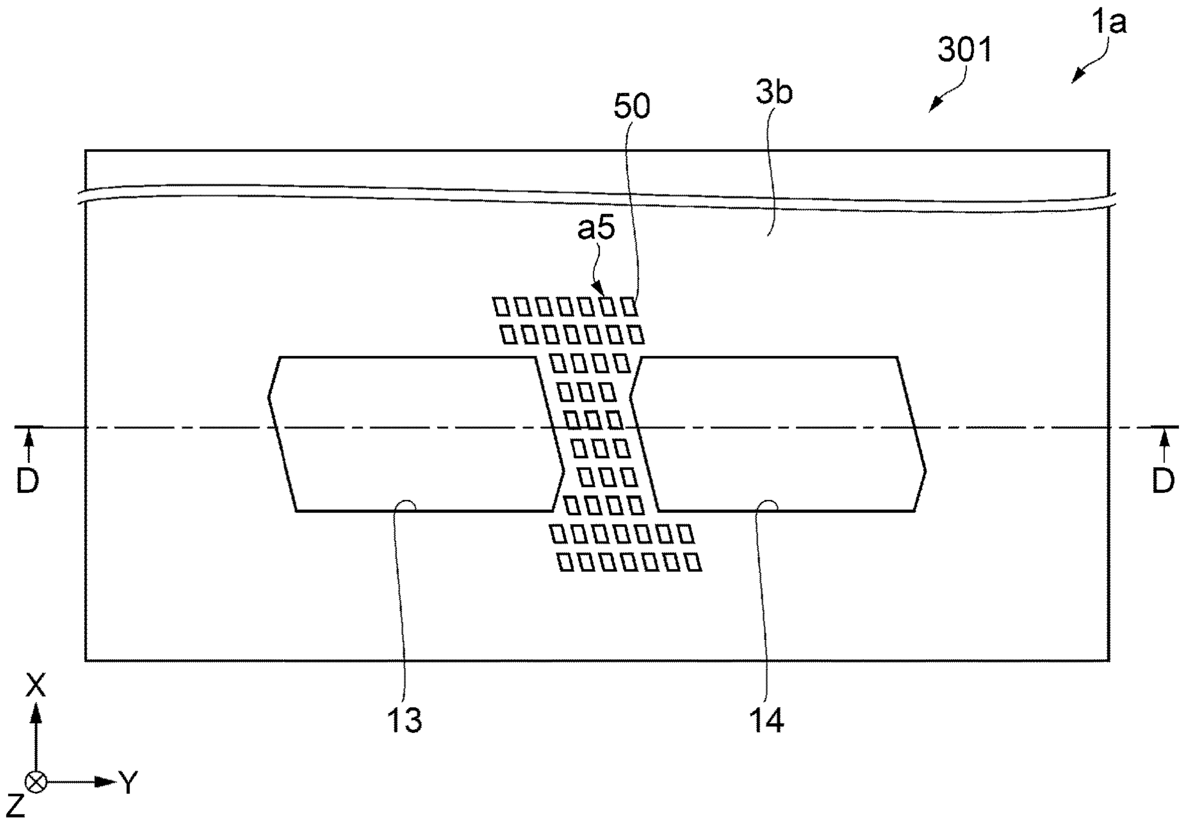
FIG. 7 is a plan view showing a configuration of a second substrate of an electronic device according to a second embodiment.
Figure 8:
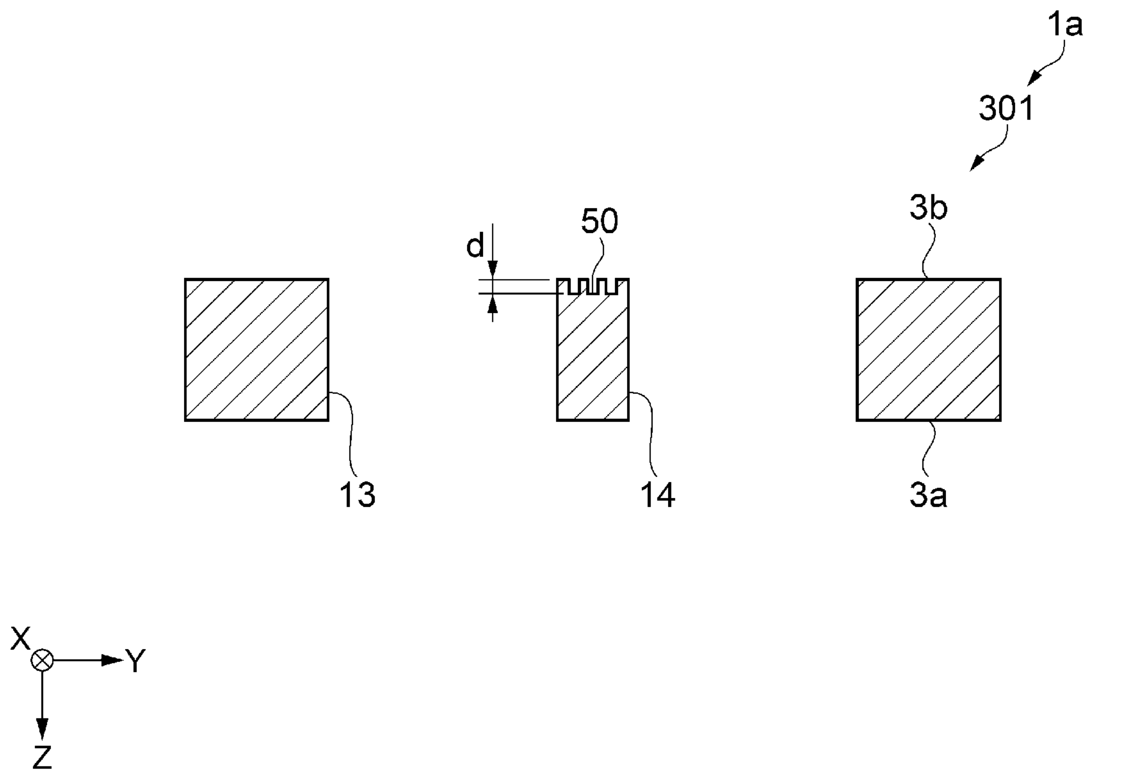
FIG. 8 is a sectional view along line D-D in FIG. 7.

As shown in FIGS. 7 and 8, the electronic device 1*a* of the embodiment has the second substrate 301 in which the plurality of dimples 50 are provided in the third surface 3*b*.

The dimples 50 are concave portions formed in the third surface 3*b* and formed in a region between the first opening 13 and the second opening 14 of the third surface 3*b*. Accordingly, when the through electrodes 15, 16 are manufactured, part of resins containing the silver fillers forming the through electrodes 15, 16 applied onto the third surface 3*b* enter the dimples 50 and a defect due to a short circuit between the through electrodes 15, 16 may be reduced.

It is preferable that depths d of the dimples 50 are from 10 μm to 30 μm. When the depths d of the dimples 50 are shallower than 10 μm, the excessive resins are beyond the dimples 50 and reduction of the defect due to a short circuit between the through electrodes 15, 16 is harder. When the depths d of the dimples 50 are deeper than 30 μm, the etching time for forming the dimples 50 is longer and production efficiency is lower.

In the plan view of the third surface 3*b*, it is preferable that areas a5 of the dimples 50 are from 200 $\mu m^2$ to 1400 $\mu m^2$. When the areas a5 of the dimples 50 are smaller than 200 $\mu m^2$, the excessive resins are beyond the dimples 50 and reduction of the defect due to a short circuit between the through electrodes 15, 16 is harder. When the areas a5 of the dimples 50 are larger than 1400 $\mu m^2$, the etching time for forming the dimples 50 is longer and production efficiency is lower.

According to the configuration, the same effects as those of the electronic device 1 of the first embodiment may be obtained and a defect due to a short circuit between the through electrodes 15, 16 may be reduced.

3. Third Embodiment

Next, a second substrate 302 of an electronic device 1*b* according to a third embodiment will be explained with reference to FIG. 9.

The second substrate 302 of the embodiment is the same as the second substrate 3 of the first embodiment except that dimples 50 are provided in the third surface 3*b*. Note that the explanation will be made with a focus on the differences from the above described first embodiment and the same items have the same signs and the explanation thereof will be omitted.

Figure 9:
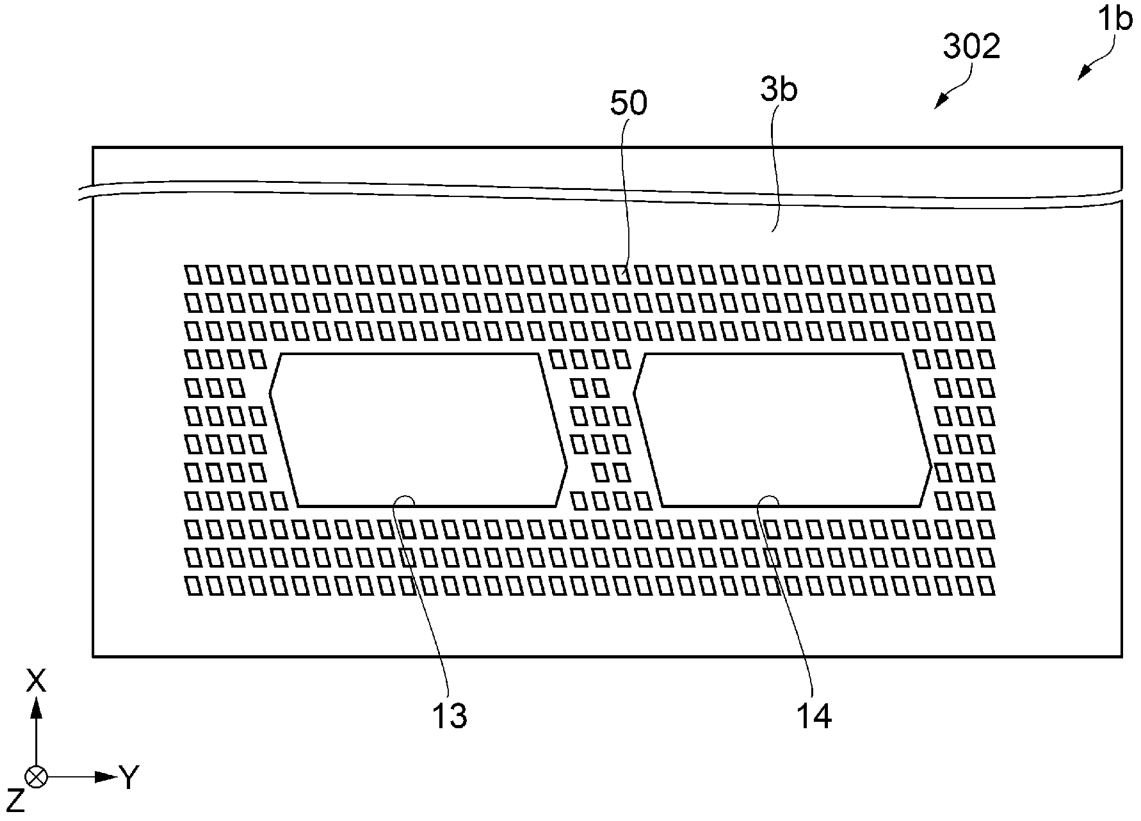
FIG. 9 is a plan view showing a configuration of a second substrate of an electronic device according to a third embodiment.

As shown in FIG. 9, the electronic device 1*b* of the embodiment has the second substrate 302 in which the plurality of dimples 50 are provided in the third surface 3*b*.

The dimples 50 are formed to surround the first opening 13 and the second opening 14 and formed also in a region between the first opening 13 and the second opening 14. Accordingly, when the through electrodes 15, 16 are manufactured, part of resins applied onto the third surface 3*b* enter the dimples 50 and a defect due to a short circuit between the through electrodes 15, 16 may be reduced. Note that the areas of the dimples 50 are the same as the areas of the dimples 50 of the second embodiment and the dimples are arranged in a staggered manner.

On the third surface 3*b*, the resins enter the dimples 50 formed to surround the openings 13, 14, and thereby, the joining areas between the second substrate 302 and the through electrodes 15, 16 may be larger and the adhesion strength may be further increased.

Note that, in the embodiment, the dimples 50 are formed to surround the first opening 13 and the second opening 14, however, the dimples may be formed to surround at least one of the first opening 13 and the second opening 14.

According to the configuration, the same effects as those of the electronic device 1 of the first embodiment may be obtained and a defect due to a short circuit between the through electrodes 15, 16 may be reduced, and further, the adhesion strength between the second substrate and the through electrodes 15, 16 may be further increased.

4. Fourth Embodiment

Next, a second substrate 303 of an electronic device 1*c* according to a fourth embodiment will be explained with reference to FIG. 10.

The second substrate 303 of the embodiment is the same as the second substrate 3 of the first embodiment except that dimples 50 are provided in the third surface 3*b*. Note that the explanation will be made with a focus on the differences from the above described first embodiment and the same items have the same signs and the explanation thereof will be omitted.

Figure 10:
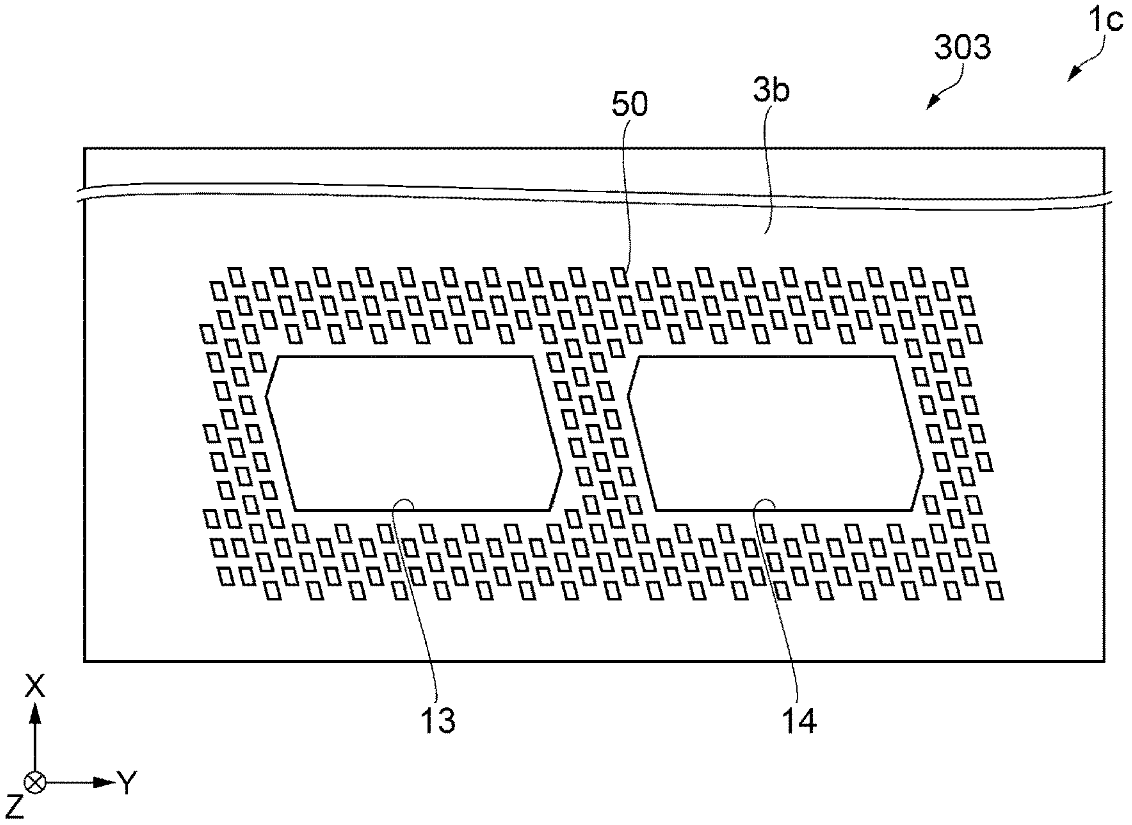
FIG. 10 is a plan view showing a configuration of a second substrate of an electronic device according to a fourth embodiment.

As shown in FIG. 10, the electronic device 1*c* of the embodiment has the second substrate 303 in which the plurality of dimples 50 are provided in the third surface 3*b*.

The dimples 50 are formed to surround the first opening 13 and the second opening 14 and formed also in a region between the first opening 13 and the second opening 14. Accordingly, a defect due to a short circuit between the through electrodes 15, 16 may be reduced. Note that the areas of the dimples 50 are the same as the areas of the dimples 50 of the second embodiment and the dimples 50 are arranged in a staggered manner with the dimples adjacent to each other shifted in the X directions.

On the third surface 3*b*, the resins enter the dimples 50 formed to surround the openings 13, 14, and thereby, the joining areas between the second substrate 303 and the through electrodes 15, 16 may be larger and the adhesion strength may be further increased.

According to the configuration, the same effects as those of the electronic device 1 of the first embodiment may be obtained and a defect due to a short circuit between the through electrodes 15, 16 may be reduced, and further, the adhesion strength between the second substrate 303 and the through electrodes 15, 16 may be further increased.

5. Fifth Embodiment

Next, a second substrate 304 of an electronic device 1*d* according to a fifth embodiment will be explained with reference to FIG. 11.

The second substrate 304 of the embodiment is the same as the second substrate 3 of the first embodiment except that dimples 50*a*, 50*b* are provided in the third surface 3*b*. Note that the explanation will be made with a focus on the differences from the above described first embodiment and the same items have the same signs and the explanation thereof will be omitted.

Figure 11:
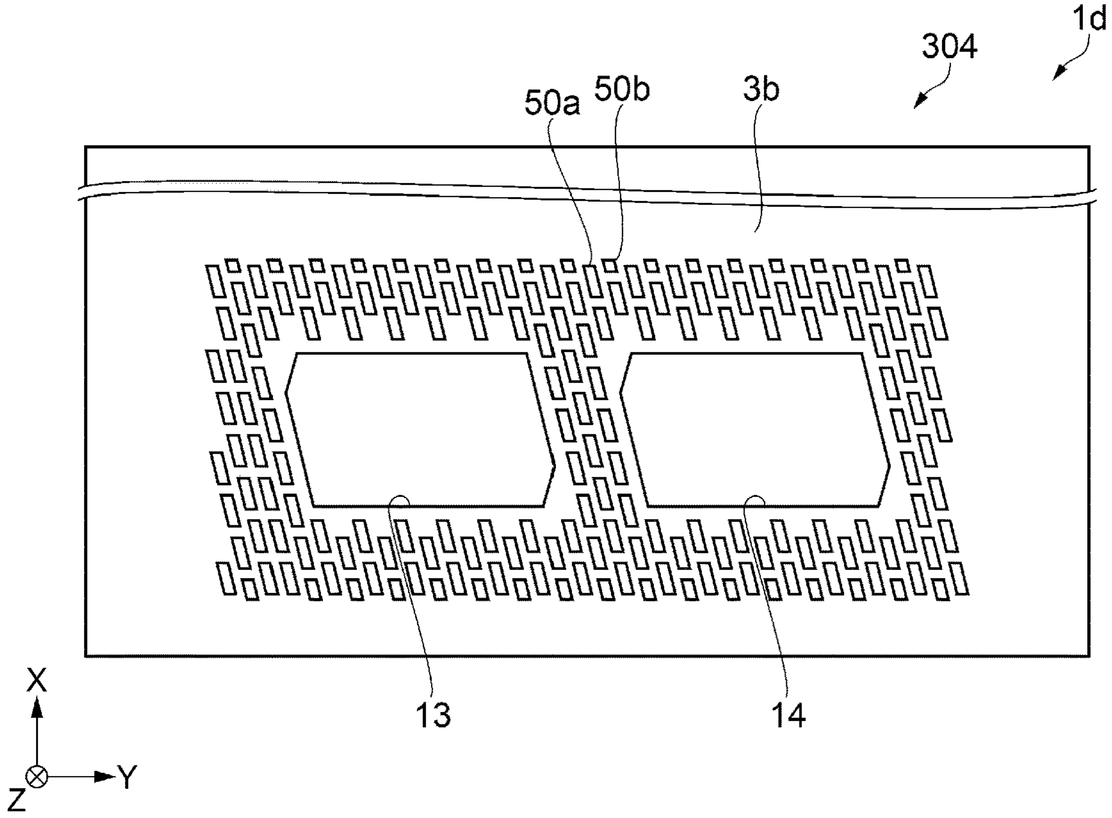
FIG. 11 is a plan view showing a configuration of a second substrate of an electronic device according to a fifth embodiment.

As shown in FIG. 11, the electronic device 1*d* of the embodiment has the second substrate 304 in which the plurality of dimples 50*a*, 50*b* are provided in the third surface 3*b*.

The dimples 50*a*, 50*b* are formed to surround the first opening 13 and the second opening 14 and the dimples 50*a* are formed also in a region between the first opening 13 and the second opening 14. Accordingly, a defect due to a short circuit between the through electrodes 15, 16 may be reduced. Note that the dimples 50*a* are elongated in the X directions and the areas thereof are larger than the areas of the dimples 50*b*. The dimples 50*a* are arranged in a staggered manner with the dimples 50*a* adjacent to each other shifted in the X directions, and the dimples 50*b* are arranged between the dimples 50*a* in the outer peripheral portion of the dimples 50*a*.

On the third surface 3*b*, the resins enter the dimples 50*a*, 50*b* formed to surround the openings 13, 14, and thereby, the joining areas between the second substrate 304 and the through electrodes 15, 16 may be larger and the adhesion strength may be further increased.

According to the configuration, the same effects as those of the electronic device 1 of the first embodiment may be obtained and a defect due to a short circuit between the through electrodes 15, 16 may be reduced, and further, the adhesion strength between the second substrate 304 and the through electrodes 15, 16 may be further increased.

6. Sixth Embodiment

Next, a second substrate 305 of an electronic device 1*e* according to a sixth embodiment will be explained with reference to FIG. 12.

The second substrate 305 of the embodiment is the same as the second substrate 3 of the first embodiment except that dimples 50*c* are provided in the third surface 3*b*. Note that the explanation will be made with a focus on the differences from the above described first embodiment and the same items have the same signs and the explanation thereof will be omitted.

Figure 12:
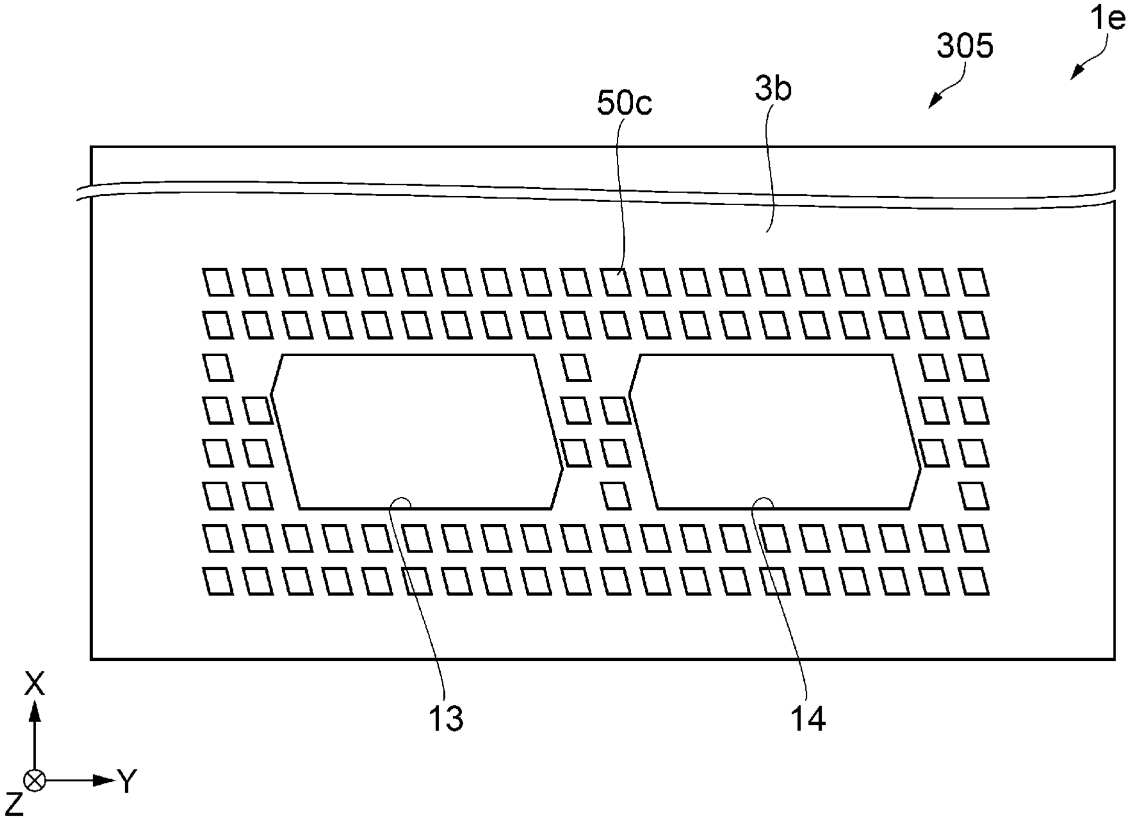
FIG. 12 is a plan view showing a configuration of a second substrate of an electronic device according to a sixth embodiment.

As shown in FIG. 12, the electronic device 1*e* of the embodiment has the second substrate 305 in which the plurality of dimples 50*c* are provided in the third surface 3*b*.

The dimples 50*c* are formed to surround the first opening 13 and the second opening 14 and formed also in a region between the first opening 13 and the second opening 14. Accordingly, a defect due to a short circuit between the through electrodes 15, 16 may be reduced. Note that the areas of the dimples 50*c* are larger than the areas of the dimples 50 of the second embodiment and the dimples 50*c* are arranged in a staggered manner.

On the third surface 3*b*, the resins enter the dimples 50*c* formed to surround the openings 13, 14, and thereby, the joining areas between the second substrate 305 and the through electrodes 15, 16 may be larger and the adhesion strength may be further increased.

According to the configuration, the same effects as those of the electronic device 1 of the first embodiment may be obtained and a defect due to a short circuit between the through electrodes 15, 16 may be reduced, and further, the adhesion strength between the second substrate 305 and the through electrodes 15, 16 may be further increased.

What is claimed is:

1. An electronic device comprising:

an element;

a first substrate including a first surface having a first electrode coupled to the element and a second electrode coupled to the element and placed in a position different from that of the first electrode; and a second substrate having a second surface and a third surface and placed with the second surface facing the first surface, wherein the second substrate has a first opening penetrating from the second surface to the third surface in a position corresponding to the first electrode, and a second opening penetrating from the second surface to the third surface in a position corresponding to the second electrode, dimples are formed, in the third surface, in a region between the first opening and the second opening, a first through electrode electrically coupled to the first electrode is provided in the first opening, a second through electrode electrically coupled to the second electrode is provided in the second opening, in a plan view of the third surface, an area of the first through electrode is larger than an area of the first opening, and in the plan view of the third surface, an area of the second through electrode is larger than an area of the second opening.

2. The electronic device according to claim 1, wherein the dimples are formed, in the third surface, to surround at least one of the first opening and the second opening.

3. The electronic device according to claim 1, wherein the dimples are concave portions formed in the third surface.

4. The electronic device according to claim 1, wherein depths of the dimples are from 10 μm to 30 μm.

5. The electronic device according to claim 1, wherein areas of the dimples are from 200 $\mu m^2$ to 1400 $\mu m^2$.

* * * * *